(12) United States Patent
Kamath et al.

(10) Patent No.: US 6,591,409 B2
(45) Date of Patent: Jul. 8, 2003

(54) MEASURING INTEGRATED CIRCUIT LAYOUT EFFICIENCY

(75) Inventors: Ganesh Kamath, Bangalore (IN); Preetham Kumar, Bangalore (IN); Alec Morton, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/995,555

(22) Filed: Nov. 28, 2001

(65) Prior Publication Data

US 2002/0066064 A1 May 30, 2002

Related U.S. Application Data

(60) Provisional application No. 60/253,942, filed on Nov. 30, 2000.

(51) Int. Cl.[7] .............................................. G06F 17/50
(52) U.S. Cl. .......................... 716/11; 716/10; 716/19; 257/371; 430/5
(58) Field of Search ..................... 716/1–21; 257/371; 430/5, 30; 703/14; 706/52; 714/733

(56) References Cited

U.S. PATENT DOCUMENTS

| | | | | |
|---|---|---|---|---|
| 5,972,541 A | * | 10/1999 | Sugawara et al. | 430/5 |
| 6,077,310 A | * | 6/2000 | Yamamoto et al. | 716/19 |
| 6,380,593 B1 | * | 4/2002 | Maxey et al. | 257/371 |

OTHER PUBLICATIONS

Allan et al., "Eye: a tool for measuring the defect sensitivity of IC layout", 1995, Dept. of Electr. Eng., Edinburgh Univ., UK, p. 60, On pp.: 5/1–5/4.*

* cited by examiner

*Primary Examiner*—Vuthe Siek
*Assistant Examiner*—Helen Rossoshek
(74) *Attorney, Agent, or Firm*—Robert L. Troike; Frederick J. Telecky, Jr.

(57) ABSTRACT

A method and system of measuring layout efficiency is disclosed wherein after the initial layout (A), and the layout is drawn (B) a layout verification step C includes identifying seed devices or layers and the devices or layers are grown according to design rules and process rules to determine the minimum area required for the design. The layout verification is performed for both device packing density and interconnect packing density and the efficiency is calculated based on the total available area and reported.(D).

6 Claims, 7 Drawing Sheets

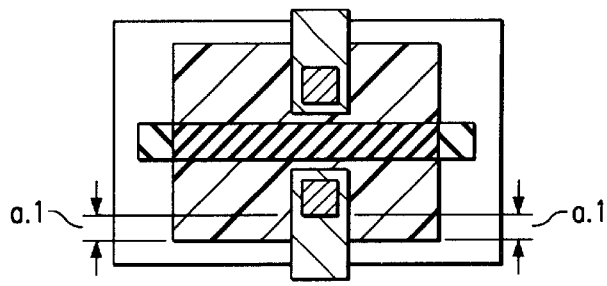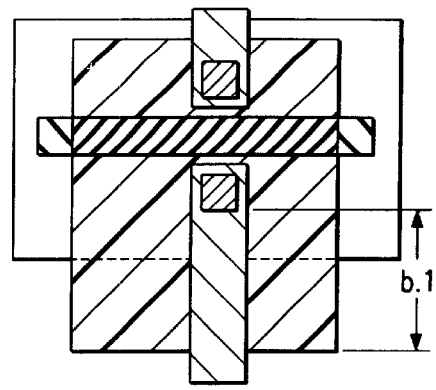
FIG. 5a        FIG. 5b
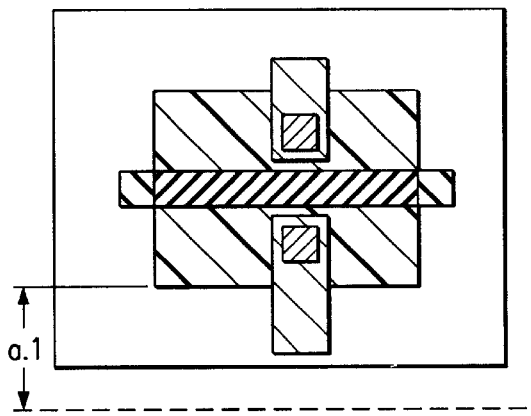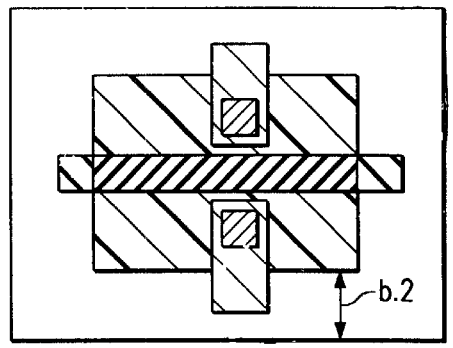
FIG. 6a        FIG. 6b

MEASURING INTEGRATED CIRCUIT LAYOUT EFFICIENCY This application claims priority under 35 USC §119(e)(1) of provisional application No. 60/253,942, filed Nov. 30, 2000.

FIELD OF INVENTION

This invention relates to manufacturing semiconductor integrated circuits and more particularly to integrated circuit layout efficiency.

BACKGROUND OF INVENTION

Integrated Circuits (IC) are manufactured on semiconductor material such as either Silicon or Germanium. Silicon being the major material because of its unique property of providing the dielectric material Silicon Dioxide (SiO2) derived by exposing it in Oxygen environment. Integrated Circuits will be designed with the aid of simulators. Later the design will be transferred to the Silicon in the form of Layout. Layout is the physical representation of an IC and consists of polygons in different masks. Each mask defines different electrical property. Stacking different mask information on Silicon, results in an interconnection of devices such as MOS transistor, diode, bipolar, resistor and capacitor. To manufacture a good quality device on Silicon with a reasonable yield, few constraints are imposed both from manufacturing and yield point of view. These constraints are termed as Design rules. Design rules are guidelines that specify the minimum dimensions and spacing for the different layers for a reliable device. They are fundamentally derived from constraints in device fabrication process and other physical layout considerations. Violating a design rule may result in a non-functional circuit else will reduce the lifetime of the circuit. Hence a designer needs to adhere to these design rules at any cost. Verifying the layout geometry for compliance of the design rules is called Design Rule Check (DRC). Extracting the device information and interconnect information from the layout geometry is called Schematic Verification (SV). Layout Verification (LV) Software is used to perform DRC and SV on the layout geometry. The extracted devices from SV are stored and will be compared against the design electrical netlist for conformance. Later layout geometry will be converted to the mask and will be shipped to the fabrication center for manufacturing.

Masks will be printed on glass plate with a chromium coating on it called as a reticle. Each reticle may contain more number of device images depending on the size of the device. Each mask defines a unique reticle. Hence different reticles for respective layers will be used for fabrication.

Transferring reticle information to Silicon is called a "shot." The complete silicon wafer is exposed with certain number of shots. If the number of shots on a wafer is reduced we will be saving lot of time and money.

Another factor in determining the cost of the IC is the Silicon wafer area used by a device. Effectively using the available area of the complete Silicon wafer means no room for wastage. The best technique of packing a layout will result in an efficient layout, which is extremely helpful in reducing the overall cost of that chip.

At present there is no mechanism available that can really measure and provide a meaningful report of the layout compactness and packing density considering the process constraints.

In the prior art are the following methods.

1. Gate count method is used by the place and route tool in estimating the area required for construction of a circuit. An additional 10 to 20% area is sacrificed for routability during the estimation phase for the design to be completed, causing a non-engineering approach. This method measures the whole IC layout area in terms of a standard NAND gate layout area.

a. The above method cannot work for analog layout such as amplifier or comparator where different factors such as matching, shielding, isolation from noise are involved.

b. If the NAND gate itself is not optimum the placement efficiency report generated will be inaccurate.

Using above techniques the estimate of a device can be pessimistic.

2. An analog layout designer uses the standard best practice methodology where they approximately allot the area depending on the complexity of the design. This approximation solely depends on the layout designer's experience.

3. Some people use visual techniques to determine the underutilized Silicon area. This method does not give a close approximation because of manual intervention.

One of the above methods is determining the benchmark in estimating area for the IC layout. These methods fail to give accurate results of an efficiency report and to set the measurable benchmarks. Because of the under utilization of Silicon area the cost of the IC is also high.

SUMMARY OF INVENTION

In accordance with one embodiment of the present invention to overcome the above problem an innovative way of measuring and improving the Silicon area efficiency of Integrated Circuit Layout has been developed. In accordance with one embodiment of the present invention the method identifies the seed devices or layers and thereby grows/shrinks it in accordance with the design/process rules. This is the minimum area required for that design. This will be compared against the total available area. The algorithm uses layout verification software to do the layer processing.

The proposed method has the following advantages.

1. The measurement technique is independent of the design rules and Process. This makes the methodology robust.

2. No need to rely on best practices.

3. Due to software intervention; a) No visual check; b) Very accurate; c) Extremely fast; d) Data can be logged for report generation, and e) A benchmark can be set for future devices.

4. Identifies the inefficient area in the layout and provides feedback.

DESCRIPTION OF DRAWINGS

FIG. 5a illustrates MOS transistor device placed with minimum overhang and

FIG. 5b illustrates device placed with more than required overhang;

FIG. 6a illustrates MOS transistor with isolation well (NWELL) with more than minimum overhang on PDIFF and FIG. 6b with minimum NWELL overhang on PDIFF;

DESCRIPTION OF PREFERRED EMBODIMENTS OF THE PRESENT INVENTION

Physical layout is defined as a set of layers in which each layer has specific electrical characteristics such as sheet resistance, unit capacitance, etc. Stacking different layers results in geometrical objects that function electrically as devices or interconnects. Design rules are a set of guidelines that specify the minimum dimensions and spacing allowed in a layout drawing. They are derived from constraints imposed by the process and other physical considerations. Violating a design rule may result in a non-functional circuit. Hence they are of crucial importance in an IC layout. Limitations in the photolithography and pattern definition give rise to several critical process and design rules.

Active and passive devices like transistors, resistors, and capacitors are fabricated on single platform called the die. These devices as required by an efficient layout should utilize the complete available die. The term efficiency is defined as the minimum area used to the total available area.

Efficiency (%) minimum area used by the device. Total available area is 100%.

Figure 1:
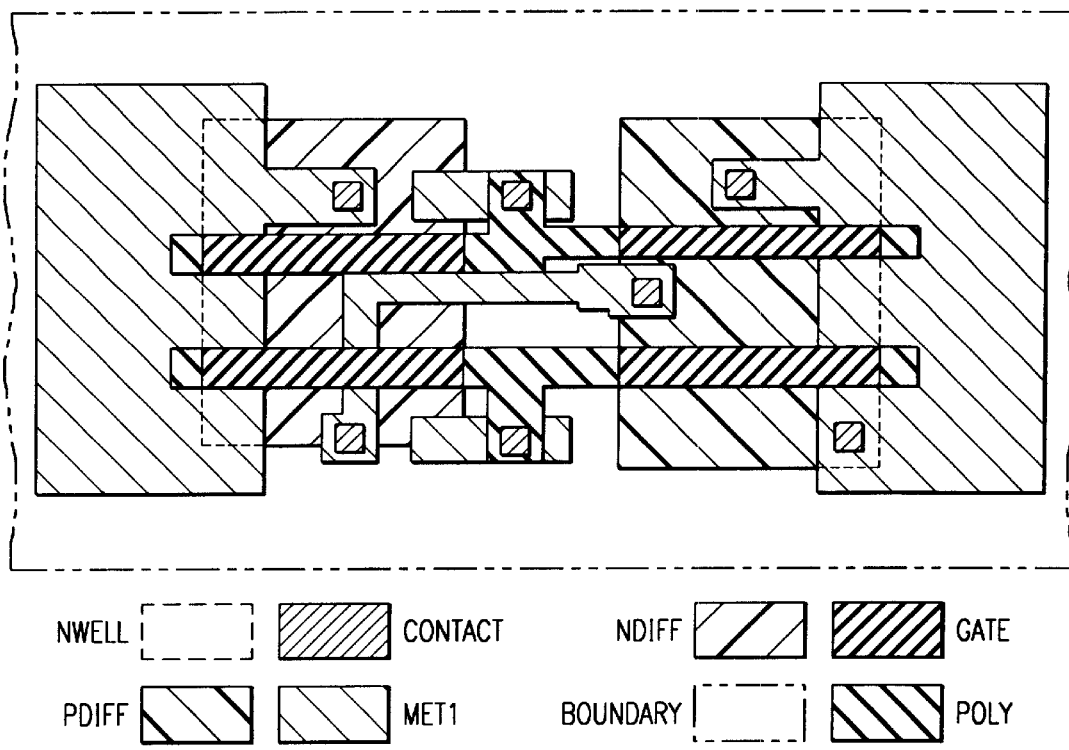
FIG. 1 illustrates a typical NAND gate layout.

FIG. 1 shows an example of a typical NAND gate layout from a library. The total area occupied by the cell is 172.480 micron square. The NWELL (NTUB) layer contains the PDIFF (P type diffusion) to form P type of transistor. In the above layout visually it is extremely difficult to find out the under utilized area of the cell.

Figure 2:
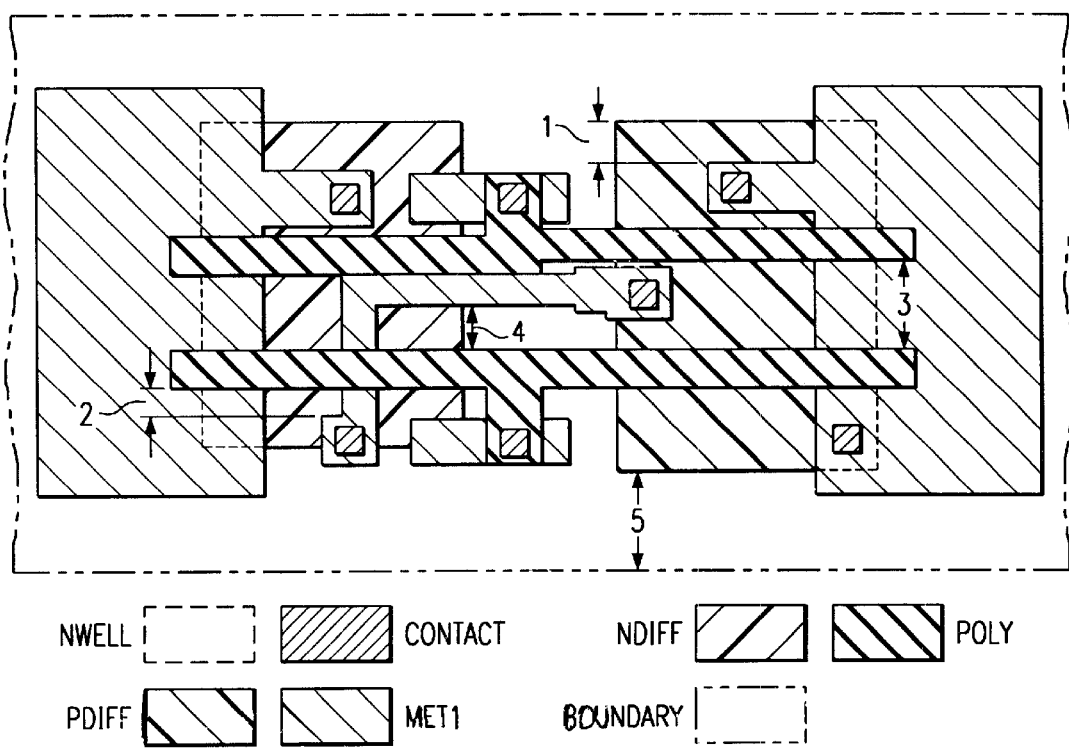
FIG. 2 illustrates the under utilized area in the cell.

FIG. 2 shows the under utilized area in the cell. The under utilized area is in terms of excess spacing rules and overlap rules where minimum rules should have been used. For example the under utilized area is marked. Note that in reference 1 the PDIFF overlap of the contact is 0.40 instead of a design rule overlap of 0.20. Note in reference 2 the contact spacing to POLY is 0.70 instead of 0.5 by the design rule. Also note by reference 3 the POLY (polysilicon) spacing is more than the minimum (with CONT or contact) is 0.7 instead of 0.59 design rule). Note by reference 4 the POLY to POLY spacing is more than minimum (without CONT) is 0.7 instead of 0.39 design rule). Note in reference 5 the NWELL overlap of PDIFF is 1.5 instead of 1.0 (design rule).

Figure 3:
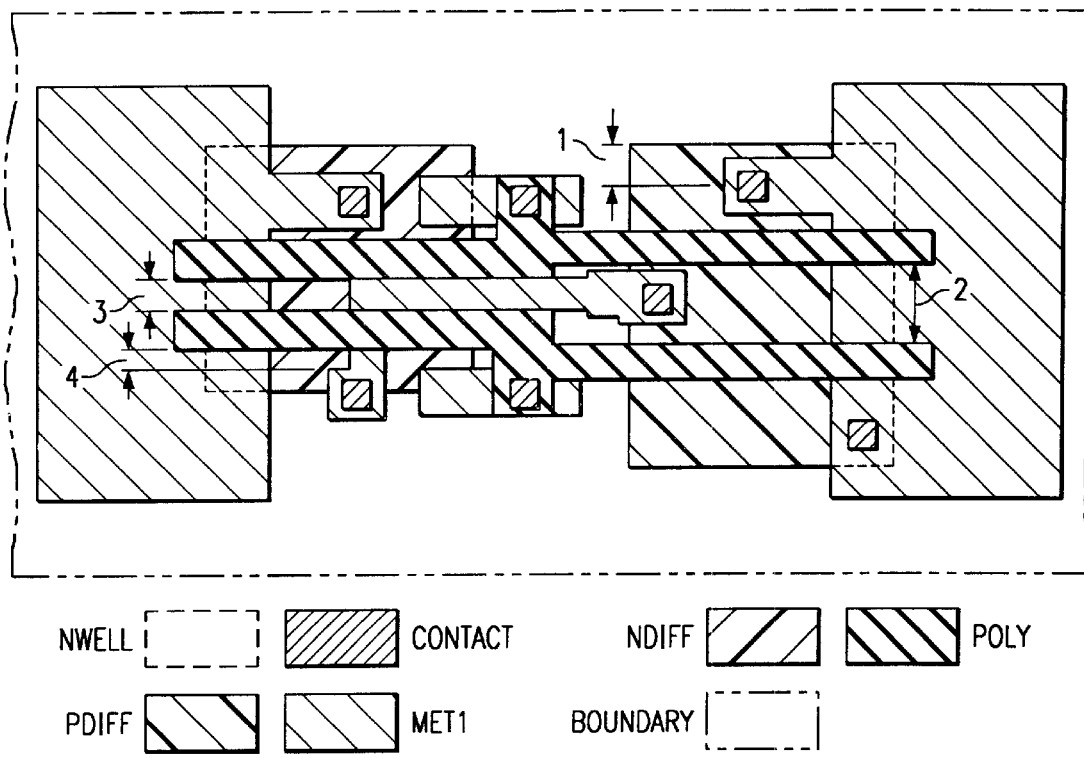
FIG. 3 illustrates an efficient layout and a summary of the efficiency improvement.

FIG. 3 shows an efficient layout drawn with minimum spacing and overlap design rules. It also shows a summary of the efficiency. The optimized cell area is 147.4 sq. micron. Reference 1 illustrates a PDIFF overlap of CONT is 0.2. Reference 2 illustrates the POLY to POLY spacing (with CONT) is 0.5. Reference 3 illustrates the POLY to POLY spacing (without CONT) is 0.3 and reference 4 illustrates the CONT spacing to POLY is 0.3. The area reduction is 24.64 sq. micron and an efficiency improvement of 14.285%. As mentioned in the prior work measuring layout efficiency has the following drawbacks:

i) FIG. 2 NAND gate was measured through visual inspection for minimum design rules. On a larger design it is extremely difficult to identify areas of under utilization. Visually verifying the layout is more time consuming. As it is manual it is error prone.

ii) In a digital design the area required for full chip is measured in terms of gate count. The placement of the gates is performed by placement tool and routed by an Auto-router. Auto-router tool will not be able to provide the actual efficiency information as it treats each gate as box, where as the gate itself may not be efficiently laid out.

iii) Standard best practices may not result in an efficient layout as they rely on personal experience.

iv) Lack of feedback mechanism makes it difficult to set the benchmark for future designs.

In the method according to one embodiment of the present invention the present invention identifies areas of under utilization in the overall chip and reports the information back to the user. The user thereafter tweaks his layout and tries to improve the efficiency.

The method identifies the seed devices or layers and thereby grows or shrinks it in accordance with the design/process rules. This is the minimum area required for that design. This will be compared against the total available area. The algorithm uses layout verification software to do the layer processing.

The method works in two different phases:
a). Device packing density
b). Interconnect packing density.

Device packing density and interconnect packing density information will be provided in the efficiency report form to the user appropriately.

a). Device Packing Density Information

Parameter of the device such as Width, Length, Resistance or Capacitance is ensured by design and simulation. This method does not try to optimize the design parameter, but by keeping them intact checks for the efficiency on the periphery of the seed device.

In general the method detects the efficiency of the given device using following steps, Device packing density algorithm
a). Identify the seed device; b). Grow the seed device in accordance with the design and process rules, and c). Calculate the ratio of the grown seed layer to the total occupied area. For example the MOS transistor detection algorithm is presented here.

b). Identify the seed device.

Seed device is termed as the basic structure required to form the device. An MOS transistor is defined as common area of diffusion (moat) and POLY over thin gate oxide. Similarly a capacitor will be defined as common area of top plate and bottom plate or a common area between two interconnect layers and pseudo-layer. A resistor is an interconnect layer or diffusion layer with a pseudo layer.

c). Grow the seed device in both Width and Length direction appropriately.

d). Calculate the ratio of the grown seed layer to the total occupied area.

Seed Device Efficiency (%)=(Grown Seed Device/Available area)*(100).

If the device is packed compactly without wastage of silicon area then this algorithm gives 100% efficiency. Any wastage in the silicon will degrade the efficiency of that device. This algorithm detects those regions that are under utilized and gives as a design violations to the user. This will help the user to determine the under utilized area.

While growing the seed device this method takes care of different kinds of layout style. For example, as shown in FIG. 4, two different configurations of MOS transistors are drawn.

Figure 4A:
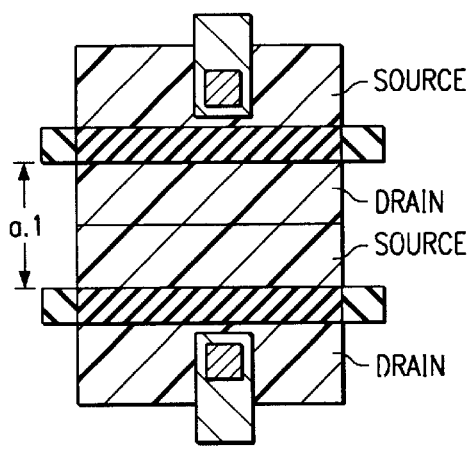
FIG. 4a illustrates a plan view of two seed devices which are placed apart more than the design rule.
Figure 4B:
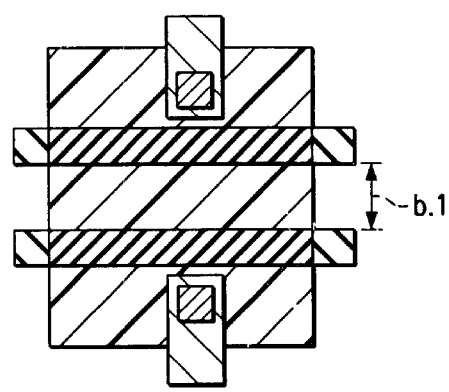
FIG. 4b illustrates a plan view of two seed devices without any wastage of silicon area.

The common area of the POLY and MOAT is the Seed device. This identifies by the moat the diffusion and by the POLY the gate of an MOS transistor. In FIG. 4a two devices are series connected MOS devices (the drain of one is shared with the source of the other) in which the gates are placed with more than required design rule. It is $X+\Delta X$, where $\Delta X$ is the wastage of silicon area. This is illustrated by dimension a.1 of FIG. 4a, where a.1=$X+\Delta X$. The gates are the parallel checkered strips. There are contacts identified by the square black pads outboard the POLY on the diffusion moat. FIG. 4b illustrates two devices without any wastage of silicon area where the spacing is X. This is illustrated by dimension b.1 of FIG. 4b, where b.1=X. The two seed devices are series connected MOS devices (the drain of one is shared with the source of the other).

Figure 4C:
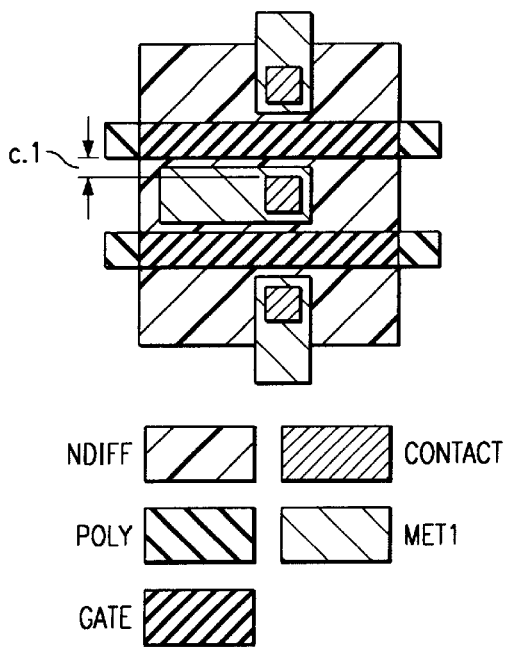
FIG. 4c illustrates a plan view of two seed devices with a contact in between then without any wastage between them.
Figure 4D:
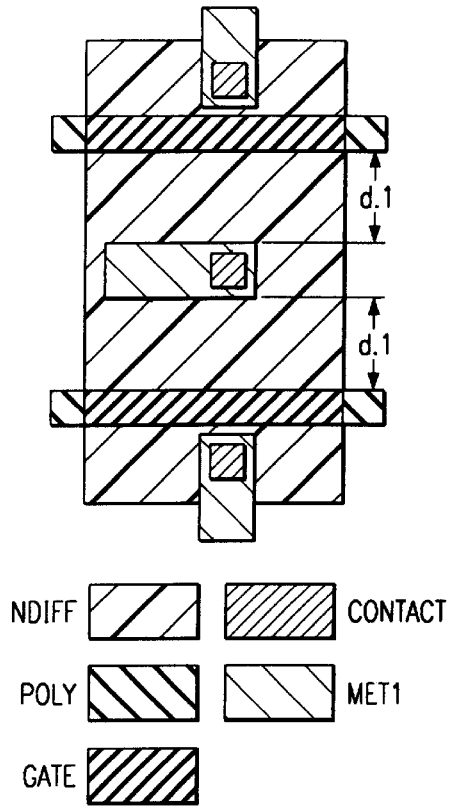
FIG. 4d illustrates a plan view of two seed devices with the seed devices placed more apart than the minimum.
Figure 4E:
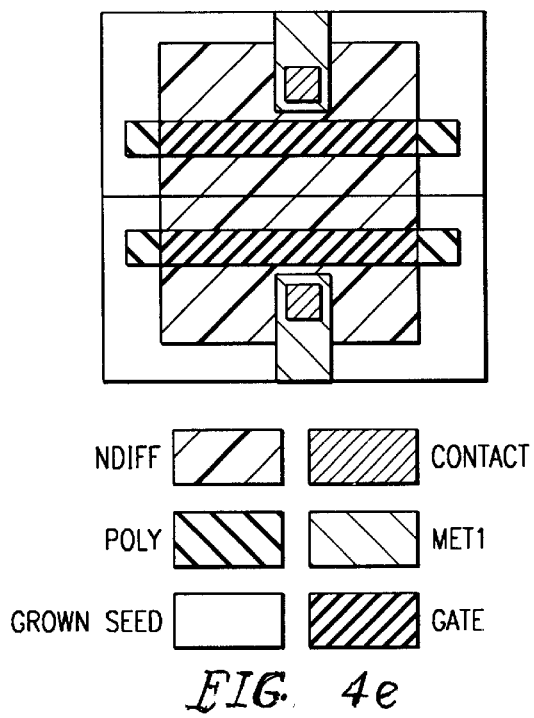
FIG. 4e illustrates two devices placed with minimum rule spacing (separated without a contact)
Figure 4F:
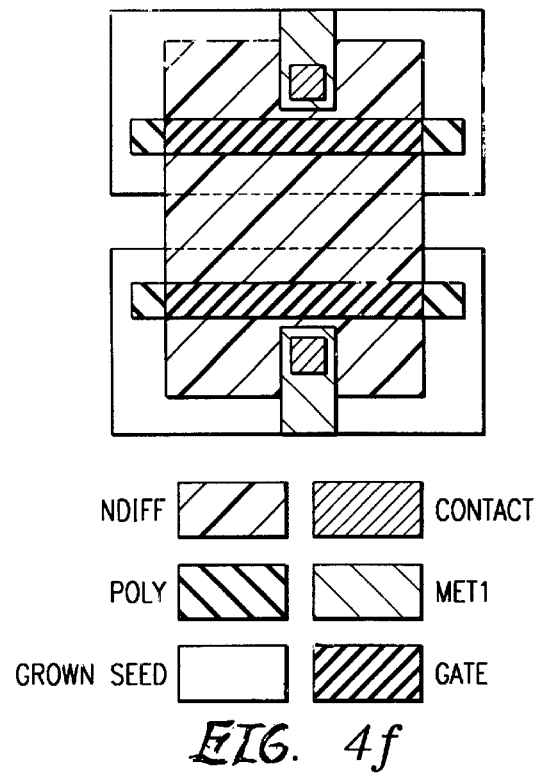
FIG. 4f illustrates two devices placed with more than minimum rule spacing (separated without a contact)

Similarly in FIG. 4c there are two seed devices with contact in between them without any wastage or minimum distance X represented by c.1. Whereas, in FIG. 4d the seed devices are placed more apart than the minimum required by d.1=$X+\Delta X$ on either side of the contact between the gates. The algorithm detects the under utilized area of the silicon in both the cases effectively. In FIG. 4a, this algorithm detects that there is no contact present in between shared source/drain region between the two seed devices and grows the seed device in length direction by half of the spacing rule between the seed devices. When it is grown with half the rule on both the seed devices, automatically the minimum required area for the seed device is identified. FIG. 4e illustrates a grown seed device generated by the algorithm to find the minimum area required considering the minimum spacing required between them. The grown seed device is merged in FIG. 4e resulting in a high efficiency. FIG. 4f illustrates two devices with more than minimum rule spacing (two devices separated without a contact). The grown seed device is generated by the algorithm to find the minimum area required considering the minimum spacing required between them. Note the grown seed device is not merged resulting in a lower efficiency.

Any small distance extra will not be considered for seed area calculation.

In FIG. 5a, MOS transistors diffusions (MOAT) are drawn with minimum overhang rule as represented by a.1=X, where X is the minimum overhang of DIFF on a CONT. The grown seed device is generated by the algorithm to find the minimum area required for a device considering the minimum overlap minimum spacing etc. In other words minimum area required for device construction identified. In FIG. 5b the device is placed with more than minimum overhang rule. Here the grown seed device remains the same irrespective of extra drawn area as indicated in FIG. 5b. FIG. 5b shows a seed device with more than required design rule of b.1=$X+\Delta X$, where X is the minimum overhang and $\Delta X$ is the wastage of silicon area. Algorithm detects the excess overhang area by growing the seed layer by minimum overhang rule beyond the contact that is X. If small excess area $\Delta x$ is left it will be not considered for seed device area calculation.

In FIG. 6a, MOS transistors isolation well (NWELL) are drawn with more than required overhang. FIG. 6a shows a seed device placed with more than required design rule represented by a.1=$X+\Delta X$, where X is the minimum overlap of the NWELL on DIFF and $\Delta X$ is the wastage of silicon area. Algorithm detects the excess overhang area by growing the seed layer by minimum overhang rule. When it is grown with that rule, automatically the minimum area required will be available. FIG. 6b illustrates the device placed with minimum overlap rule with b.1=X, where X is the minimum NWELL overlap required on a DIFF. Note that grown seed area is the same as the drawn minimum NWELL area. If small excess area $\Delta X$ is left it will be not taken for calculation.

Figure 7A:
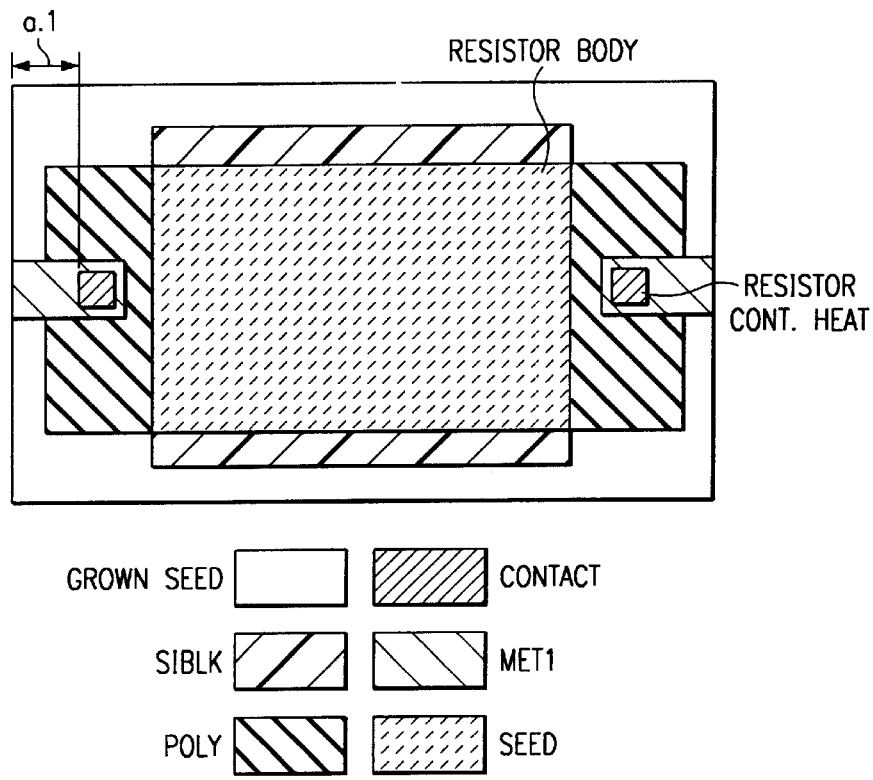
FIG. 7a illustrates SIBLK resistor contact heads with minimum overhang of POLY on CONT and FIG. 7b with more than minimum overhang of POLY on CONT.
Figure 7B:
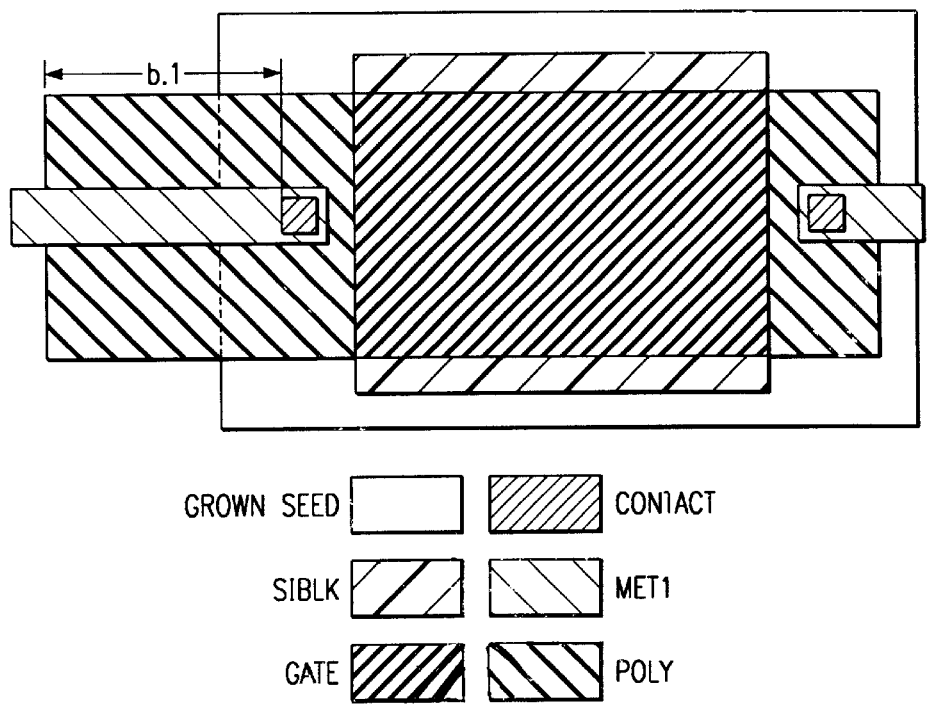

In FIG. 7a, silicon block (SIBLK) resistor contact heads are drawn with the required minimum spacing a.1=X where X is the minimum POLY overhang on CONT. Grown seed device is generated by the algorithm to find the minimum area required considering the minimum overhang rule of POLY on CONT. The SIBLK layer on POLY defines the region of high resistance and in FIG. 7b the resistor contact lead is shown with more than required overhang. FIG. 7b shows a seed device with more than minimum overhang rule or b.1=$X+\Delta X$, where X is the minimum POLY overhang and $\Delta X$ is the wastage area of silicon area. Algorithm detects the excess overhang area by growing the seed layer by minimum overhang rule of POLY on CONT taking contact head into consideration. When it is grown with that rule, automatically it will be covered. Note in FIG. 7b the grown seed remains minimum in spite of bigger drawn area. If small excess area is left it will be not taken for calculation.

Figure 8A:
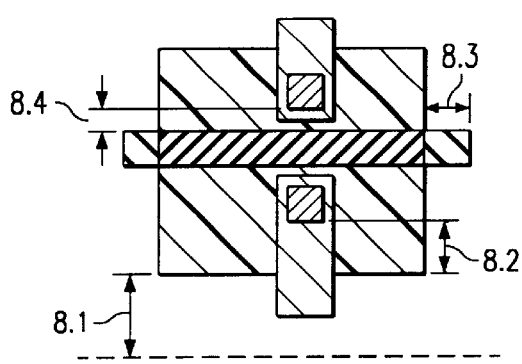
FIG. 8a illustrates an MOS transistor made drawn efficiently with minimum rule.
Figure 8B:
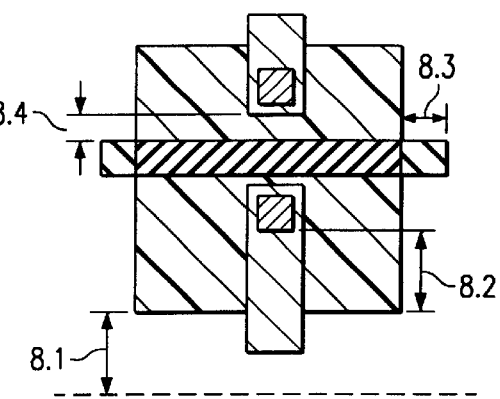
FIG. 8b illustrates an MOS transistor drawn inefficiently.

FIG. 8a, summarizes the MOS transistor drawn efficiently. In FIG. 8a reference 8.1=X where X is the minimum NWELL overlap on PDIFF, reference 8.2=Y where Y is the minimum PDIFF overlap on CONT, reference 8.3=Z where Z is the minimum overhang of POLY on PDIFF, and reference 8.4=P where P is the minimum spacing between POLY and CONT. FIG. 8b summarizes the MOS transistor drawn inefficiently. Reference 8.1=$X+\Delta X$, where X is the minimum NWELL overlap on PDIFF and $\Delta X$ is the wastage, reference 8.2=$Y+\Delta Y$, where Y is the minimum PDIFF overlap on the CONT and $\Delta Y$ is the wastage, reference 8.3=$Z+\Delta Z$, where Z is the minimum overhang of POLY on PDIFF and $\Delta Z$ is the wastage, and reference 8.4=$P+\Delta P$ where P is the minimum spacing between POLY and CONT and $\Delta P$ is the wastage. Algorithm detects all the $\Delta X$, $\Delta Y$, $\Delta z$, and $\Delta P$ as an excess area and will not add these into the grown seed layer calculations.

Interconnect packing density.

Interconnects are used in the physical layout to connect two or more different nodes. To effectively achieve the best efficiency interconnect layers play a major role. The algorithm interconnect layer by its minimum dimensions such as spacing and width, then tries to find its density with respect to the available area. An interconnect is identified by not touching a pseudolayer.

In general the algorithm detects the efficiency of interconnect using following steps, Interconnect packing density algorithm.

a). Identify the interconnect layer.

b). Grow the interconnect layer in accordance with the design and process width and spacing rules.

c). Calculate the ratio of the grown interconnect layer to the total occupied area.

Interconnect Efficiency(%)=(Grown Interconnected layer/Available area)*(100).

Figure 9:
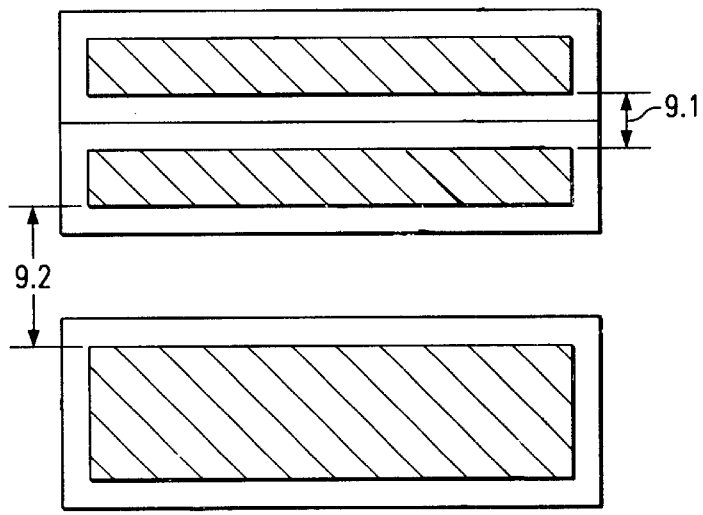
FIG. 9 illustrates interconnect layers spaced with minimum spacing and more than minimum spacing rule.

Detection of the interconnect packing density varies for spacing and width rules as follows:

Detection of interconnect packing for spacing rule. As shown in FIG. 9, if interconnect layers are spaced more than the minimum spacing rule, algorithm works in a following way, a). Grow the interconnect layer by ½ of the minimum spacing between the interconnect layer.

b). Find out the ratio between grown interconnect layer with respect to total full chip area.

Interconnect efficiency=(Grown interconnect layer area/Total Full chip area)*100.

Reference 9.1 in FIG. 9 illustrates the minimum MET1 spacing rule of X and reference 9.2 illustrates the more than minimum spacing of X+ΔX where X is the minimum spacing rule and ΔX is the wastage.

Figure 10:
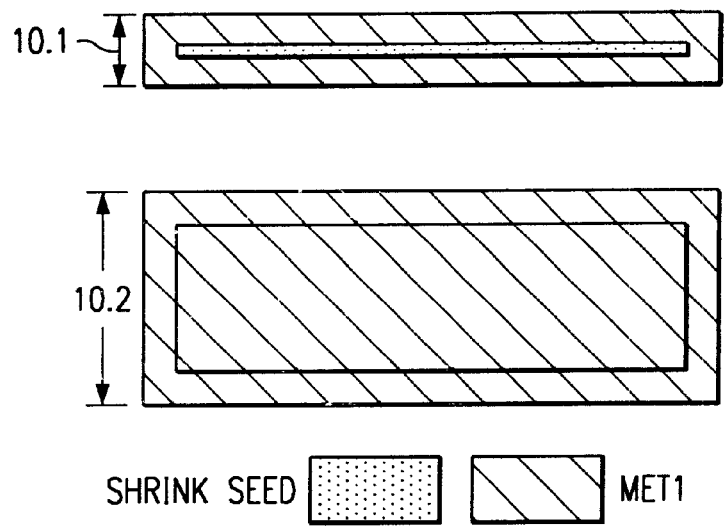
FIG. 10 illustrates interconnect device with minimum width and more than minimum width.

Detection of interconnect packing for width rule. As shown in FIG. 10 if interconnect layers are drawn with more than the required width rule, algorithm works in a following way, A). Shrink the interconnect layer by ½ of the minimum width of the interconnect layer. If the interconnect is drawn with minimum width then it automatically vanishes and STEP A area becomes zero.

B). Subtract the STEP A area from the total chip area. If STEP A area is zero then STEP B area will be full chip area.

C). Find out the ratio between the STEP B area with respect to total full chip area. Interconnect efficiency (STEP B area/Total Full chip area) 100.

Reference 10.1 of FIG. 10 illustrates X where X is the minimum width and reference 10.2 illustrates X the minimum width plus the ΔX wastage.

Later both the interconnect efficiency for spacing and width rule are added and provided as a total interconnect efficiency. If the interconnect layer is efficiently used then user will get maximum interconnect efficiency.

Using this methodology provides both package and interconnect density very accurately. This can be applied at any stage of the design, thereby helping the user to modify the layout and hence improve the efficiency incrementally. It also gives a report, which can be used for future design area estimations. This methodology is robust as it is independent of the design and process. The report generated by AutoRoute tool is not as accurate as the report generated by this methodology because most of the AutoRoute tool considers library cell information for efficiency calculation. If library cell by design is under-utilized the whole report will be incorrect.

For every organization depending on the complexity of the chip and arena they can have the efficiency benchmark set for different levels.

For example, a pure analog design layout can be of lower efficiency compared to a digital design layout due to design and performance constraints.

PHYSICAL LAYOUT EFFICIENCY CHECKER has been accepted in all MSP designs. This methodology considerably increases the efficiency of a drawn layout thereby directly impacting the Net revenue per wafer. As this methodology can be easily adopted for any process it is more robust. 10% reduction of die size can mean 350 million dollars extra revenue and 250 million dollars extra profit according to statistics.

Figure 11:
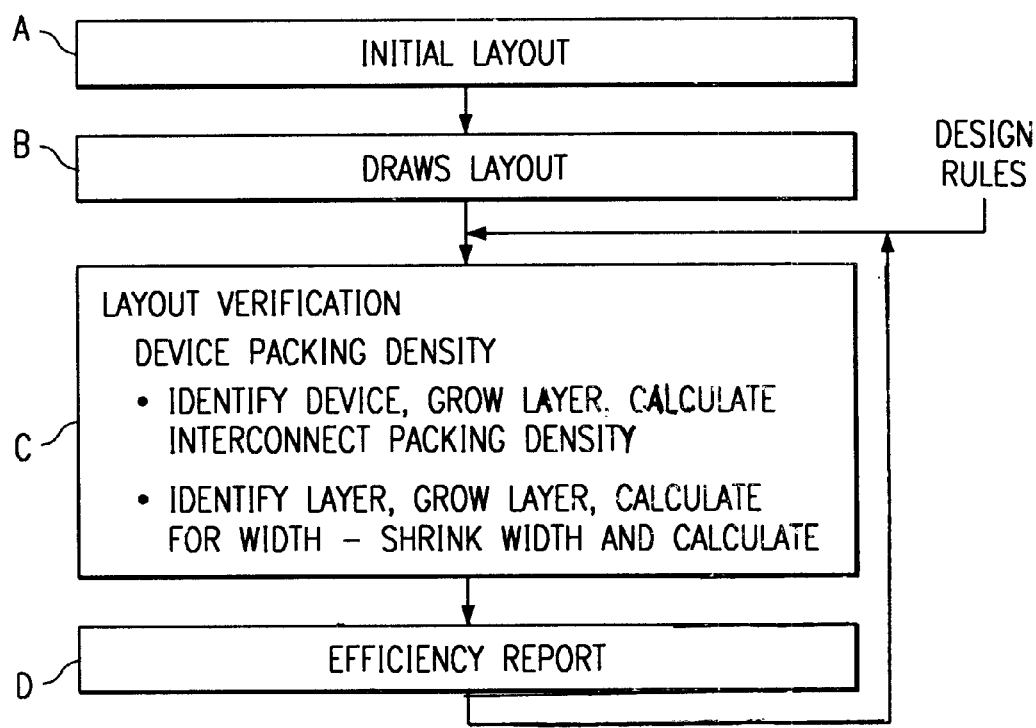
FIG. 11 illustrates the method for layout design according to the present invention.

In accordance with one embodiment of the present invention the method discussed above is used in connection with a layout method wherein an initial layout design with interconnections is provided in Step A of FIG. 11. The next step is a program such as Cadence draws a layout in Step B. The next step C is a layout verification step. In accordance with the present invention this layout verification tool is responsive to the layout and the design rules with minimum spacing and interconnections and by identifying the device packing density and interconnection packing density checks and calculates the efficiency using the process discussed above. As a result a report in Step D is made of the efficiency and/or the results are used to redraw the layout in step B. The layout verification step C includes the device packing density steps and the interconnect packing density steps discussed above. This program for device packing density identifies the device such as MOS transistor, capacitor, resistor, etc. as discussed above, grows the seed device in accordance with the design and process rules and calculates the ratio of the grown seed layer to the total occupied area as discussed above. For the interconnect packing density to identify the layer, grow the interconnect layer in accordance with the design rules as discussed above and calculate the efficiency and the detection of interconnect packing or width rule steps discussed above to determine efficiency.

What is claimed is:

1. A method of measuring integrated circuit design layout efficiency comprising the steps of:

providing an initial chip layout;

identifying areas of under-utilization in the overall chip layout according to design/process rules, and reporting the under-utilization areas back to the designer wherein said identifying step includes identifying seed devices or layers;

modifying the layout to improve efficiency wherein said modifying step includes growing or shrinking devices or layers in accordance with the design/process rules to approach a minimum area required for that design layout and comparing this minimum area to a total available area to determine efficiency.

2. The method of claim 1 wherein layout verification software is used in the identifying and modifying steps.

3. A method of measuring integrated circuit design layout efficiency comprising the steps of:

providing an initial chip layout;

identifying areas of under-utilization in the overall chip layout according to design rules, and reporting the under-utilization areas back to the designer wherein the identifying step includes determining the efficiency of an interconnect layer by layout's minimum dimensions in spacing and width and determining the layout density with respect to an available area.

4. A method of determining the efficiency of an interconnect layer comprising the following steps:

identifying the interconnect layer;

growing the interconnect layer in accordance with a design layout and the design layout's process width and spacing rules; and determining the interconnect efficiency by calculating the ratio of area of the grown interconnect layer to the total available area as follows:

Interconnect Efficiency (%)=Grown interconnect layer area/available area*100.

5. The method of claim 4, wherein said growing step includes growing the interconnect layer by one half (½) of the minimum spacing between the interconnect layer and calculating the ratio between grown interconnect layers and the calculating step includes determining the ratio between the grown interconnect layer with respect to total full chip area according to:

Interconnect efficiency(%)=(Grown interconnect layer area/Total Full chip area)*100.

6. A method of determining an interconnect packing for width rule comprising the steps of:

shrinking an interconnect layer by one half (½) of a minimum width of the interconnect layer leaving a first area and if the interconnect layer is drawn with minimum width then it automatically vanishes;

subtracting the first area from a total fill chip area to leave a second area and if the first area is zero then the second area will be the fill chip area; and determining efficiency by calculating the ratio between the second area with respect to the total full chip area according to:

Interconnect Efficiency (%)=(second area/total full chip area)*100.

* * * * *